United States Patent
Tian

(10) Patent No.: US 10,985,214 B2
(45) Date of Patent: Apr. 20, 2021

(54) FLEXIBLE DISPLAY SUBSTRATE FOR FOLDABLE DISPLAY APPARATUS, METHOD OF MANUFACTURING FLEXIBLE DISPLAY SUBSTRATE, AND FOLDABLE DISPLAY APPARATUS

(71) Applicant: BOE Technology Group Co., Ltd., Beijing (CN)

(72) Inventor: Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 16/607,186

(22) PCT Filed: May 7, 2019

(86) PCT No.: PCT/CN2019/085843
§ 371 (c)(1),
(2) Date: Oct. 22, 2019

(87) PCT Pub. No.: WO2019/233230
PCT Pub. Date: Dec. 12, 2019

(65) Prior Publication Data
US 2020/0243607 A1    Jul. 30, 2020

(30) Foreign Application Priority Data

Jun. 5, 2018 (CN) .......................... 201810570011.1

(51) Int. Cl.
*H01L 27/28* (2006.01)
*G02F 1/1333* (2006.01)
(Continued)

(52) U.S. Cl.
CPC .......... *H01L 27/283* (2013.01); *G02F 1/1368* (2013.01); *G02F 1/133305* (2013.01);
(Continued)

(58) Field of Classification Search
CPC ............ H01L 27/283; H01L 21/26513; H01L 21/266; H01L 21/268; H01L 21/324;
(Continued)

(56) References Cited

U.S. PATENT DOCUMENTS 7,868,323 B2    1/2011   Shiba et al.
2006/0275950 A1   12/2006   Lee
(Continued)

FOREIGN PATENT DOCUMENTS

| CN | 101202296 A | 6/2008 |
| CN | 106653810 A | 5/2017 |
| CN | 108807420 A | 11/2018 |

OTHER PUBLICATIONS

First Office Action, including Search Report, for Chinese Patent Application No. 201810570011.1, dated Oct. 9, 2019, 12 pages.
(Continued)

*Primary Examiner* — Mohammed R Alam
(74) *Attorney, Agent, or Firm* — Westman, Champlin & Koehler, P.A.

(57) ABSTRACT

A flexible display substrate for a foldable display apparatus, a method of manufacturing the flexible display substrate, and a foldable display apparatus are disclosed. The flexible display substrate includes: a first region corresponding to a non-foldable region of the foldable display apparatus; a second region corresponding to a foldable region of the foldable display apparatus; a plurality of first pixel units disposed in the first region, configured to display an image, and each including a polysilicon thin film transistor; and a plurality of second pixel units disposed in the second region, configured to display an image, and each including an organic thin film transistor.

19 Claims, 4 Drawing Sheets

(51) Int. Cl.

| | |
|---|---|
| *G02F 1/1368* | (2006.01) |
| *G09G 3/36* | (2006.01) |
| *H01L 21/265* | (2006.01) |
| *H01L 21/266* | (2006.01) |
| *H01L 21/268* | (2006.01) |
| *H01L 21/324* | (2006.01) |
| *H01L 29/66* | (2006.01) |
| *H01L 29/786* | (2006.01) |
| *H01L 51/00* | (2006.01) |
| *H01L 51/05* | (2006.01) |
| *H01L 27/32* | (2006.01) |

(52) U.S. Cl.
CPC ......... *G09G 3/3648* (2013.01); *H01L 21/266* (2013.01); *H01L 21/268* (2013.01); *H01L 21/26513* (2013.01); *H01L 21/324* (2013.01); *H01L 27/286* (2013.01); *H01L 29/6675* (2013.01); *H01L 29/78672* (2013.01); *H01L 51/0097* (2013.01); *H01L 51/0562* (2013.01); *G09G 2380/02* (2013.01); *H01L 27/3274* (2013.01); *H01L 2251/5338* (2013.01)

(58) Field of Classification Search
CPC ............... H01L 27/286; H01L 29/6675; H01L 29/78672; H01L 51/0097; H01L 51/0562; H01L 27/3274; H01L 2251/5338; H01L 27/1218; H01L 27/1222; H01L 27/1259
See application file for complete search history.

(56) References Cited

U.S. PATENT DOCUMENTS

| | | |
|---|---|---|
| 2008/0157067 A1 | 7/2008 | Shiba et al. |
| 2014/0232956 A1* | 8/2014 | Kwon ................. H01L 27/3276 349/12 |
| 2018/0197931 A1* | 7/2018 | Liang .................. H01L 51/5237 |

OTHER PUBLICATIONS

Second Office Action, including Search Report, for Chinese Patent Application No. 201810570011.1, dated Mar. 26, 2020, 12 pages.

* cited by examiner

FLEXIBLE DISPLAY SUBSTRATE FOR FOLDABLE DISPLAY APPARATUS, METHOD OF MANUFACTURING FLEXIBLE DISPLAY SUBSTRATE, AND FOLDABLE DISPLAY APPARATUS

CROSS-REFERENCE TO RELATED APPLICATION

This application is a Section 371 National Stage Application of International Application No. PCT/CN2019/085843, filed on May 7, 2019, entitled "FLEXIBLE DISPLAY SUBSTRATE FOR FOLDABLE DISPLAY APPARATUS, METHOD OF MANUFACTURING FLEXIBLE DISPLAY SUBSTRATE, AND FOLDABLE DISPLAY APPARATUS", which has no yet published, which claims priority to Chinese Application No, 201810570011.1, filed on Jun. 5, 2018, incorporated herein by reference in their entireties.

TECHNICAL FIELD

Embodiments of the present disclosure relate to the field of display technology, and particularly to a flexible display substrate for a foldable display apparatus, a method of manufacturing the flexible display substrate, and a foldable display apparatus.

BACKGROUND

A stress will be generated in a flexible display substrate after the flexible display substrate is bent, so that the electrical property of internal devices of a flexible display screen is degraded by multiple bending.

SUMMARY

Embodiments of the present disclosure provide a flexible display substrate for a foldable display apparatus, the flexible display substrate including: a first region corresponding to a non-foldable region of the foldable display apparatus, and a second region corresponding to a foldable region of the foldable display apparatus; a plurality of first pixel units disposed in the first region, configured to display an image, and each including a polysilicon thin film transistor; and a plurality of second pixel units disposed in the second region, configured to display an image, and each including an organic thin film transistor.

According to embodiments of the present disclosure, the flexible display substrate further includes: a drive circuit disposed in a portion of the first region corresponding to a non-display area of the flexible display substrate, and electrically connected with the polysilicon thin film transistor and the organic thin film transistor.

According to embodiments of the present disclosure, a number of the first region is two, a number of the second region is one, and the second region is located between two first regions.

According to embodiments of the present disclosure, a number of the first region is greater than two, one said second region is disposed between two adjacent said first regions, the flexible display substrate includes two said drive circuits, and the two drive circuits are respectively located in two said first regions which are respectively adjacent to sides of the flexible display substrate.

According to embodiments of the present disclosure, the drive circuit includes an amorphous silicon transistor.

According to embodiments of the present disclosure, the polysilicon thin film transistor includes a low-temperature polysilicon thin film transistor.

Embodiments of the present disclosure further provide a foldable display apparatus including the above flexible display substrate.

Embodiments of the present disclosure further provide a method of manufacturing a flexible display substrate for a foldable display apparatus, wherein: the flexible display substrate includes a first region corresponding to a non-foldable region of the foldable display apparatus, and a second region corresponding to a foldable region of the foldable display apparatus, the method including: forming a plurality of polysilicon thin film transistors in the first region; and forming a plurality of organic thin film transistors in the second region.

According to embodiments of the present disclosure, the method further includes: forming an amorphous silicon transistor of a drive circuit in a portion of the first region corresponding to a non-display area of the flexible display substrate.

According to embodiments of the present disclosure, forming the plurality of polysilicon thin film transistors in the first region includes: forming active layers of the plurality of polysilicon thin film transistors in the first region; forming the plurality of organic thin film transistors in the second region includes: forming active layers of the plurality of organic thin film transistors in the second region; forming the plurality of polysilicon thin film transistors in the first region further includes: forming a blocking layer in the second region in which the active layers of the plurality of organic thin film transistors are formed; performing an ion implantation on the active layers of the plurality of polysilicon thin film transistors formed in the first region; and stripping the blocking layer formed in the second region.

According to embodiments of the present disclosure, forming the plurality of polysilicon thin film transistors in the first region further includes: performing an annealing treatment on the active layers of the plurality of polysilicon thin film transistors formed in the first region.

According to embodiments of the present disclosure, the flexible display substrate includes a plurality of said first regions, and the active layers of the polysilicon thin film transistors in the plurality of first regions are sequentially annealed by an excimer laser.

According to embodiments of the present disclosure, the flexible display substrate includes: a plurality of first pixel units disposed in the first region, configured to display an image, and each including the polysilicon thin film transistor; and a plurality of second pixel units disposed in the second region, configured to display an image, and each including the organic thin film transistor.

DETAILED DESCRIPTION

Embodiments of the present disclosure provide a flexible display substrate for a foldable display apparatus, a method of manufacturing the flexible display substrate, and a foldable display apparatus. Thereby, for example, the flexibility and bending resistance of the flexible display substrate are improved, prolonging the service life of the foldable display apparatus while ensuring the electrical property of devices of the foldable display apparatus.

In order that the objects, technical solutions and advantages of the present disclosure are more apparent, a detailed description of embodiments of the present disclosure will be further made as below in conjunction with the accompanying drawings.

Figure 1:
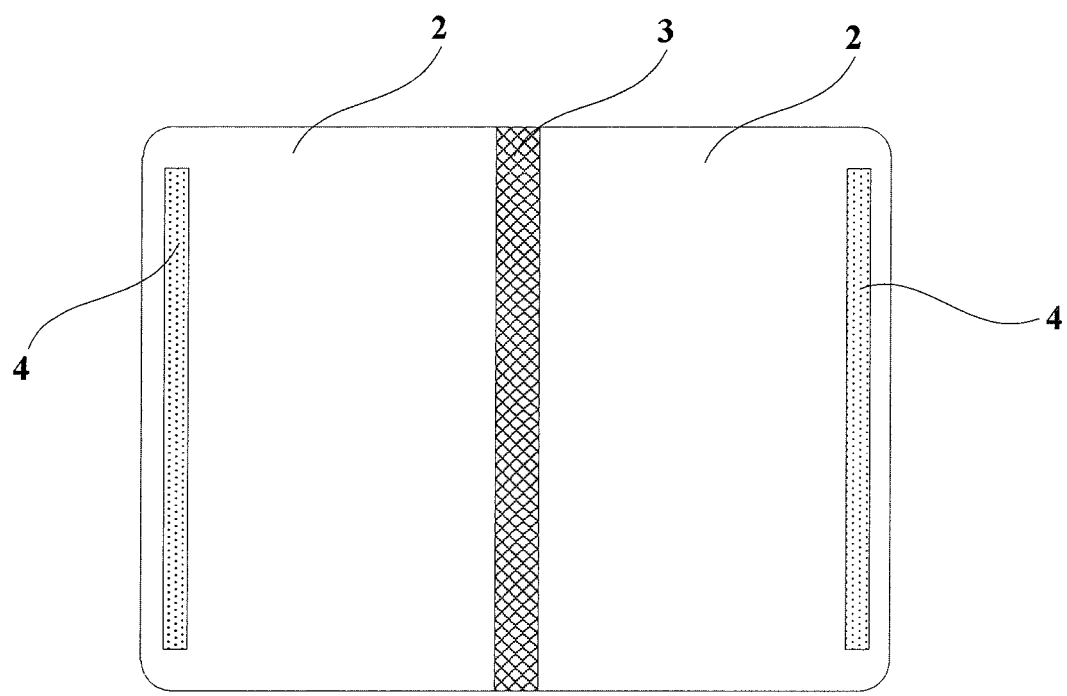
FIG. 1 is a schematic diagram showing a structure of a flexible display substrate for a foldable display apparatus according to an embodiment of the present disclosure.
Figure 2:
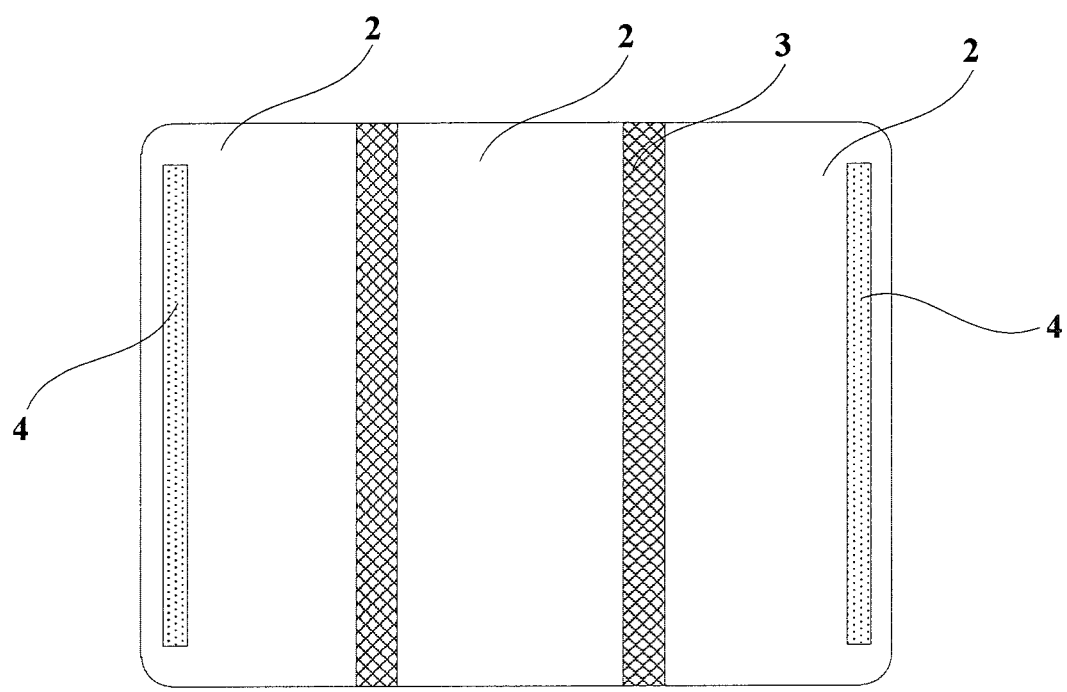
FIG. 2 is a schematic diagram showing a structure of a flexible display substrate for a foldable display apparatus according to another embodiment of the present disclosure.
Figure 3:
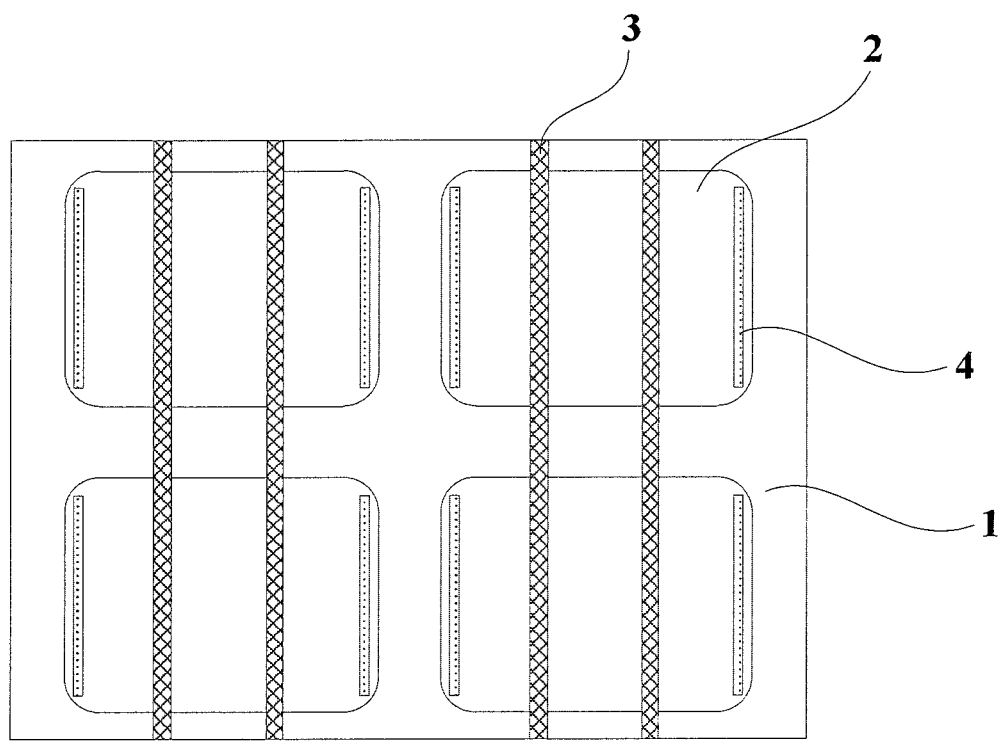
FIG. 3 is a schematic diagram showing a structure of a flexible display substrate for a foldable display apparatus according to still another embodiment of the present disclosure.

As shown in FIGS. 1 to 3, a flexible display substrate 1 for a foldable display apparatus according to an embodiment of the present disclosure includes: a first region 2 corresponding to a non-foldable region of the foldable display apparatus, and a second region 3 corresponding to a foldable region of the foldable display apparatus; a plurality of first pixel units disposed in the first region 2, configured to display an image, and each including a polysilicon thin film transistor; and a plurality of second pixel units disposed in the second region 3, configured to display an image, and each including an organic thin film transistor. The polysilicon thin film transistor may be a low-temperature polysilicon thin film transistor.

In the case where the foldable display apparatus is a liquid crystal display apparatus, each of the polysilicon thin film transistor and the organic thin film transistor is configured to control the deflection of a liquid crystal through a pixel electrode and a common electrode. In the case where the foldable display apparatus is an organic light-emitting diode display apparatus, each of the polysilicon thin film transistor and the organic thin film transistor is configured to control a light-emitting diode.

In the flexible display substrate 1 according to the embodiment of the present disclosure, the first region 2 corresponding to the non-foldable region of the foldable display apparatus, and the second region 3 corresponding to the foldable region of the foldable display apparatus are manufactured separately. The first pixel unit in the first region corresponding to the non-foldable region includes the polysilicon thin film transistor, and the second pixel unit in the second region corresponding to the foldable region includes the organic thin film transistor. In this way, the flexibility and bending resistance of the display substrate corresponding to the foldable region of the foldable display apparatus are effectively improved, thereby prolonging the service life of the foldable display apparatus including the flexible display substrate 1.

In embodiments of the present disclosure, in order to effectively reduce a display difference between the first region 2 and the second region 3, a display compensation may be performed by means of an external compensation.

As shown in FIGS. 1 to 3, in embodiments of the present disclosure, the flexible display substrate 1 further includes a drive circuit 4 disposed in a portion of the first region 2 corresponding to a non-display area of the flexible display substrate, and the drive circuit 4 is electrically connected with the polysilicon thin film transistor and the organic thin film transistor. In embodiments of the present disclosure, the drive circuit 4 includes an amorphous silicon transistor.

In the embodiments of the present disclosure, the drive circuit 4 is disposed to correspond to the non-foldable region of the foldable display apparatus. The drive circuit 4 can be never bent during folding the flexible display substrate 1. Therefore, a risk of a degradation of the electrical property of devices of the flexible display substrate 1 is effectively reduced, thereby reducing an influence on the display effect of the flexible display substrate 1.

As shown in FIG. 1, in an embodiment of the present disclosure, a number of the first region 2 is two, a number of the second region 3 is one, and the second region 3 is located between two first regions 2.

When there are two first regions 2, the flexible display substrate 1 may be applied to a foldable display apparatus that only needs to be folded in two. In this case, the flexible display substrate 1 includes two drive circuits 4, and the two drive circuits 4 are disposed in the two first regions 2, respectively.

As shown in FIGS. 2 and 3, in another embodiment of the present disclosure, a number of the first region 2 is greater than two, one second region 3 is disposed between two adjacent first regions 2, the flexible display substrate 1 includes two drive circuits 4, and the two drive circuits 4 are respectively located in two first regions 2 which are respectively adjacent to sides of the flexible display substrate.

When the number of the first region 2 is greater than two, one second region 3 is disposed between every two adjacent first regions 2, the flexible display substrate 1 includes two drive circuits 4, and the two drive circuits 4 are respectively disposed in two first regions 2 which are respectively adjacent to the sides of the flexible display substrate. The foldable display apparatus including the flexible display substrate 1 may realize multiple folding. Therefore, the foldable display apparatus may be made greater in size.

Based on the same inventive concept, embodiments of the present disclosure further provide a foldable display apparatus including the above flexible display substrate.

The flexibility and bending resistance of the display substrate of the foldable display apparatus according to the embodiments of the present disclosure are relatively good, so that the foldable display apparatus has a relatively long service life.

Figure 4:
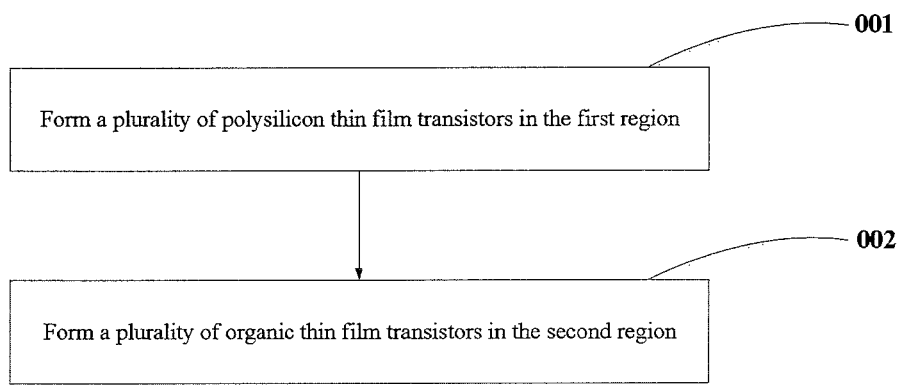
FIG. 4 is a flow diagram showing a method of manufacturing a flexible display substrate for a foldable display apparatus according to an embodiment of the present disclosure.

As shown in FIG. 4, based on the same inventive concept, embodiments of the present disclosure further provide a method of manufacturing a flexible display substrate. The flexible display substrate includes a first region corresponding to a non-foldable region of the foldable display apparatus, and a second region corresponding to a foldable region of the foldable display apparatus. The method includes:

a step 001 of forming a plurality of polysilicon thin film transistors in the first region; and a step 002 of forming a plurality of organic thin film transistors in the second region.

In the method of manufacturing the flexible display substrate according to the embodiments of the present disclosure, the first region corresponding to the non-foldable region of the foldable display apparatus, and the second region corresponding to the foldable region of the foldable display apparatus are manufactured separately. The polysilicon thin film transistors are formed in the region corresponding to the non-foldable region, and the organic thin film transistors are formed in the region corresponding to the foldable region. This method effectively improves the flexibility and bending resistance of the flexible display substrate corresponding to the foldable region of the foldable display apparatus, thereby prolonging the service life of the foldable display apparatus including the flexible display substrate.

In embodiments of the present disclosure, the method further includes: forming an amorphous silicon transistor of a drive circuit in a portion of the first region corresponding to a non-display area of the flexible display substrate.

In the embodiments of the present disclosure, the drive circuit is formed to correspond to the non-foldable region of the foldable display apparatus. The drive circuit can be never bent during folding the flexible display substrate. Therefore, a risk of a degradation of the electrical property of devices of the flexible display substrate is effectively reduced, thereby reducing an influence on the display effect of the flexible display substrate.

In embodiments of the present disclosure, forming the plurality of polysilicon thin film transistors in the first region includes:

forming active layers of the plurality of polysilicon thin film transistors in the first region;

forming the plurality of organic thin film transistors in the second region includes:

forming active layers of the plurality of organic thin film transistors in the second region;

forming the plurality of polysilicon thin film transistors in the first region further includes:

forming a blocking layer in the second region in which the active layers of the plurality of organic thin film transistors are formed;

performing an ion implantation process on the active layers of the plurality of polysilicon thin film transistors formed in the first region; and stripping the blocking layer formed in the second region.

For example, after active layers of the polysilicon thin film transistors are formed of a low-temperature polysilicon in the first region, an organic thin film may be deposited by a vacuum evaporation of an organic material, so that active layers of the organic thin film transistors are formed in the second region. For a product with a low resolution requirement, the active layer may also be formed by inkjet printing.

In the method of manufacturing the flexible display substrate according to the embodiments of the present disclosure, it is not necessary to perform an ion implantation on the active layers formed in the second region. Therefore, before ions are implanted into the active layers of the polysilicon thin film transistors formed in the first region, the second region in which the active layers of the organic thin film transistors are formed is blocked. In this way, a waste of the ion implantation can be effectively avoided. In embodiments of the present disclosure, a blocking layer may be a photoresist.

In embodiments of the present disclosure, forming the plurality of polysilicon thin film transistors in the first region further includes:

performing an annealing treatment on the active layers of the plurality of polysilicon thin film transistors formed in the first region.

In embodiments of the present disclosure, the flexible display substrate includes a plurality of first regions. The active layers of the polysilicon thin film transistors in the plurality of first regions are sequentially annealed by an excimer laser.

In embodiments of the present disclosure, the flexible display substrate includes: a plurality of first pixel units disposed in the first region, configured to display an image, and each including the polysilicon thin film transistor; and a plurality of second pixel units disposed in the second region, configured to display an image, and each including the organic thin film transistor.

With the method of manufacturing the flexible display substrate according to the embodiments of the present disclosure, it is necessary to perform an annealing treatment on only the active layers of the polysilicon thin film transistors formed in the first region corresponding to the non-foldable region of the foldable display apparatus. In embodiments of the present disclosure, the annealing treatment may be performed by an excimer laser. In this way, use of a laser resource can be effectively reduced, thereby decreasing production cost.

The display apparatus includes: a Low-Temperature Poly-Silicon Thin Film Transistor Liquid Crystal Display (LTPS TFT-LCD), and a Low Temperature Poly-Silicon Active-Matrix Organic Light Emitting Diode (LTPS-AMOLED) display apparatus.

Specific types of the display apparatus are not limited. For example, the display apparatus may be a mobile telephone, a notebook computer, an electronic book, a tablet computer, and the like, which are foldable.

The embodiments of the present disclosure provide a flexible display substrate, a method of manufacturing the flexible display substrate, and a foldable display apparatus. Thereby, the flexibility and bending resistance of the flexible display substrate are improved, prolonging the service life of the foldable display apparatus while ensuring the electrical property of devices of the foldable display apparatus.

Although some exemplary embodiments of the present disclosure have been shown above, it would be appreciated by a person skilled in the art that modifications may be made therein without departing from the principle and spirit of the present disclosure, the scope of which is defined in the appended claims and their equivalents.

What is claimed is:

1. A flexible display substrate for a foldable display apparatus, the flexible display substrate comprising:
   a first region corresponding to a non-foldable region of the foldable display apparatus, and a second region corresponding to a foldable region of the foldable display apparatus;
   a plurality of first pixel units disposed in the first region, configured to display an image, and each comprising a polysilicon thin film transistor; and
   a plurality of second pixel units disposed in the second region, configured to display an image, and each comprising an organic thin film transistor.

2. The flexible display substrate of claim 1, further comprising:
   a drive circuit disposed in a portion of the first region corresponding to a non-display area of the flexible display substrate, and electrically connected with the polysilicon thin film transistor and the organic thin film transistor.

3. The flexible display substrate of claim 2, wherein:
   a number of the first region is two, a number of the second region is one, and the second region is located between two first regions.

4. The flexible display substrate of claim 2, wherein:
   a number of the first region is greater than two, one said second region is disposed between two adjacent said first regions, the flexible display substrate comprises two said drive circuits, and the two drive circuits are respectively located in two said first regions which are respectively adjacent to sides of the flexible display substrate.

5. The flexible display substrate of claim 2, wherein: the drive circuit comprises an amorphous silicon transistor.

6. The flexible display substrate of claim 1, wherein:

the polysilicon thin film transistor comprises a low-temperature polysilicon thin film transistor.

7. A foldable display apparatus comprising the flexible display substrate according to claim 1.

8. A method of manufacturing a flexible display substrate for a foldable display apparatus, wherein: the flexible display substrate comprises a first region corresponding to a non-foldable region of the foldable display apparatus, and a second region corresponding to a foldable region of the foldable display apparatus, the method comprising: forming a plurality of polysilicon thin film transistors in the first region; and forming a plurality of organic thin film transistors in the second region; wherein: forming the plurality of organic thin film transistors in the second region comprises: forming active layers of the plurality of organic thin film transistors from an organic material in the second region.

9. The method of claim 8, further comprising:

forming an amorphous silicon transistor of a drive circuit in a portion of the first region corresponding to a non-display area of the flexible display substrate, wherein the drive circuit is electrically connected with the polysilicon thin film transistor and the organic thin film transistor.

10. The method of claim 8, wherein: forming the plurality of polysilicon thin film transistors in the first region comprises: forming active layers of the plurality of polysilicon thin film transistors in the first region; forming the plurality of polysilicon thin film transistors in the first region further comprises: forming a blocking layer in the second region in which the active layers of the plurality of organic thin film transistors are formed; performing an ion implantation on the active layers of the plurality of poly silicon thin film transistors formed in the first region; and stripping the blocking layer formed in the second region.

11. The method of claim 10, wherein:

forming the plurality of polysilicon thin film transistors in the first region further comprises:

performing an annealing treatment on the active layers of the plurality of polysilicon thin film transistors formed in the first region.

12. The method of claim 11, wherein:

the flexible display substrate comprises a plurality of said first regions, and the active layers of the polysilicon thin film transistors in the plurality of first regions are sequentially annealed by an excimer laser.

13. The method of claim 8, wherein:

the flexible display substrate comprises:

a plurality of first pixel units disposed in the first region, configured to display an image, and each comprising the polysilicon thin film transistor; and a plurality of second pixel units disposed in the second region, configured to display an image, and each comprising the organic thin film transistor.

14. The flexible display substrate of claim 1, wherein:

the organic thin film transistor comprises an active layer of an organic material.

15. The flexible display substrate of claim 2, wherein:

a number of the first region is two, a number of the second region is one, and the second region is located between two first regions, the flexible display substrate comprises two said drive circuits respectively located in the two first regions.

16. The foldable display apparatus of claim 7, wherein:

the foldable display apparatus comprises at least one of a low-temperature polysilicon thin film transistor liquid crystal display and a low-temperature polysilicon active matrix organic light emitting diode display apparatus.

17. The method of claim 9, wherein: a number of the first region is two, a number of the second region is one, and the second region is located between two first regions, the flexible display substrate comprises two said drive circuits respectively located in the two first regions.

18. The method of claim 9, wherein: a number of the first region is greater than two, one said second region is disposed between two adjacent said first regions, the flexible display substrate comprises two said drive circuits, and the two drive circuits are respectively located in two said first regions which are respectively adjacent to sides of the flexible display substrate.

19. The method of claim 8, wherein:

forming the plurality of polysilicon thin film transistors in the first region comprises:

forming active layers of the plurality of polysilicon thin film transistors from a low-temperature polysilicon in the first region.

* * * * *